(12) United States Patent
Huang et al.

(10) Patent No.: US 9,034,702 B2
(45) Date of Patent: May 19, 2015

(54) METHOD FOR FABRICATING SILICON NANOWIRE FIELD EFFECT TRANSISTOR BASED ON WET ETCHING

(75) Inventors: Ru Huang, Beijing (CN); Jiewen Fan, Beijing (CN); Yujie Ai, Beijing (CN); Shuai Sun, Beijing (CN); Runsheng Wang, Beijing (CN); Jibin Zou, Beijing (CN); Xin Huang, Beijing (CN)

(73) Assignee: Peking University, Beijing (CN)

( * ) Notice: Subject to any disclaimer, the term of this patent is extended or adjusted under 35 U.S.C. 154(b) by 395 days.

(21) Appl. No.: 13/511,123

(22) PCT Filed: Nov. 18, 2011

(86) PCT No.: PCT/CN2011/082447
§ 371 (c)(1),
(2), (4) Date: May 21, 2012

(87) PCT Pub. No.: WO2012/159424
PCT Pub. Date: Nov. 29, 2012

(65) Prior Publication Data
US 2012/0302027 A1 Nov. 29, 2012

(30) Foreign Application Priority Data
May 26, 2011 (CN) .......................... 2011 1 0138735

(51) Int. Cl.
*H01L 21/336* (2006.01)
*H01L 21/8234* (2006.01)
(Continued)

(52) U.S. Cl.
CPC .... *H01L 29/66772* (2013.01); *H01L 29/42392* (2013.01); *H01L 29/78696* (2013.01)

(58) Field of Classification Search
CPC ............ H01L 29/0665; H01L 29/0673; H01L 29/66795; H01L 29/42384; H01L 29/42392; H01L 29/78696; H01L 29/66772
USPC ........................... 438/142, 197, 289, 294, 297
See application file for complete search history.

(56) References Cited

U.S. PATENT DOCUMENTS 5,780,344 A * 7/1998 Hasegawa ..................... 438/275
6,855,606 B2 2/2005 Chen et al.
(Continued)

FOREIGN PATENT DOCUMENTS

CN 1855390 3/2005
CN 1801478 7/2006
(Continued)

*Primary Examiner* — Colleen A Matthews
*Assistant Examiner* — Quovaunda V Jefferson
(74) *Attorney, Agent, or Firm* — Makoto Tsunozaki; Bret E. Field; Bozicevic, Field & Francis LLP

(57) ABSTRACT

Disclosed herein is a method for fabricating a silicon nanowire field effect transistor based on a wet etching. The method includes defining an active region; depositing a silicon oxide film as a hard mask, forming a pattern of a source and a drain and a fine bar connecting the source and the drain; transferring the pattern on the hard mask to a silicon substrate by performing etching process for the silicon substrate; performing ion implanting; etching the silicon substrate by wet etching, so that the silicon fine bar connecting the source and the drain is suspended; reducing the silicon fine bar to a nano size to form a silicon nanowire; depositing a polysilicon film; forming a polysilicon gate line acrossing the silicon nanowire by electron beam lithography and forming a structure of nanowire-all-around; forming a silicon oxide sidewall at both sides of the polysilicon gate line, by depositing a silicon oxide film and subsequently etching the silicon oxide film; forming the source and the drain by using ion implantation and high temperature annealing, so that the silicon nanowire field effect transistor is finally fabricated. The method is compatible with a conventional integrated circuit fabrication technology. The fabrication process is simple and convenient, and has a short cycle.

8 Claims, 7 Drawing Sheets

(51) Int. Cl.
*H01L 29/66* (2006.01)
*H01L 29/423* (2006.01)
*H01L 29/786* (2006.01)

(56) References Cited

U.S. PATENT DOCUMENTS

2005/0048409 A1* 3/2005 Elqaq et al. .................. 430/312
2006/0216897 A1* 9/2006 Lee et al. ..................... 438/282
2008/0128760 A1 6/2008 Jun et al.
2008/0246021 A1 10/2008 Suk et al.
2009/0230380 A1 9/2009 Leon et al.

FOREIGN PATENT DOCUMENTS

| | | |
|---|---|---|
| CN | 101295677 A | 10/2008 |
| CN | 101999162 A | 3/2011 |
| WO | 2009108173 | 9/2009 |

* cited by examiner

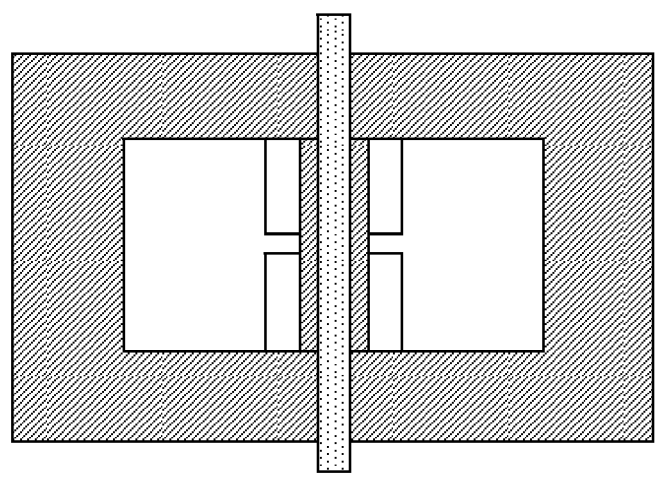
Figure 6
In Figures:
 silicon oxide      polysilicon      substrate

METHOD FOR FABRICATING SILICON NANOWIRE FIELD EFFECT TRANSISTOR BASED ON WET ETCHING

FIELD OF THE INVENTION

The present invention relates to a method for fabricating a silicon nanowire field effect transistor based on a wet etching, which belongs to a field of ultra-large-scale integrated circuit fabrication technology.

BACKGROUND OF THE INVENTION

Nowadays, semiconductor fabrication industry is rapidly developing under guidance of Moore's law, performance and integration degree of an integrated circuit are constantly increased while power consumption of the integrated circuit is reduced as much as possible. Therefore, in future a subject of the semiconductor fabrication industry will focus on fabrication of an ultra-short channel device with high performance and low power consumption. After entering into a 22 nm technology node, a conventional planar field effect transistor has an increased leakage current, a more severe short-channel effect and a drain-induced barrier lowering (DIBL) effect so as not to be suitable for development of the semiconductor fabrication industry. In order to overcome the above problems, several new-structured semiconductor devices, such as a Double Gate FET, a FinFET, a Tri-Gate FET and a Gate-all-around (GAA) Nanowire (NW) FET have been proposed and have got a wide attention. By means of a multiple-gate structure, particularly a gate-all-around structure, a control ability of a gate to a channel can be greatly enhanced, so that it is difficult for an electric field to directly pass through the channel from a drain to a source. In this way, the drain-induced barrier lowering effect can be substantially reduced, the leakage current can be decreased, and the short-channel effect can be well suppressed. Since a good gate-control ability can be obtained by the gate structure, it is not necessary to perform a highly doping to the channel as in the conventional planar field effect transistor to suppress the short-channel effect. An advantage of lightly doping the channel is that a decrease of mobility due to scattering is reduced, so that the mobility in the multiple-gate structure device is greatly improved. Furthermore, because in a one-dimensional nanowire field effect transistor there is a one-dimensional quasi-ballistic transferring effect, the mobility of the device is further increased. Therefore, as a new-structured device, the GAA NE FET will become a promising option for replacing the conventional planar field effect transistor.

A silicon nanowire field effect transistor was formed through a synthesis method by Yi Cui et al. from Harvard University [Yi Cui, et al., Science 293, 1289 (2001)]. By using a high sensitivity of the silicon nanowire field effect transistor, a change of a PH value was successfully measured. However, several defects that are impossible to be overcome for such method for forming the silicon nanowire by synthesis lie in as follows. (1) Silicon nanowires grown by the synthesis do not have a uniform direction, in most of cases they are grown irregularly and have no uniform direction. (2) The silicon nanowires grown by the synthesis have various sizes and have a difficulty to be precisely controlled. (3) Such method, in which a bottom-up process method is used, is difficult to be compatible with a conventional semiconductor fabrication technology, in which a top-down process method is used.

Furthermore, a silicon nanowire field effect transistor was successfully fabricated over a bulk silicon substrate through using a SiGe sacrificial layer by Sun Dae Suk et al. from Samsung Electronics of Korea [Sung Dae Suk, et al., IEDM Tech. Dig., p. 717-720 2005.]. A core process used is to suspend the silicon nanowire by removing the SiGe sacrificial layer under a silicon film through wet etching. However, such fabrication process is complicated, and a fabrication cycle is long.

Also, a silicon nanowire field effect transistor was successfully fabricated over a SOI substrate by S. Bangsaruntip et al. from IBM [S. Bangsaruntip, et al., IEDM Tech. Dig., p. 297-300 2009]. A core process used by them is as follows. A pattern of a drain, a source and a fine bar connecting the drain and the source are formed on a slimmed silicon film formed by performing a slimming process for a silicon film over the SOI substrate, and a diameter of the silicon nanowire is reduced by subsequent hydrogen annealing process and sacrificial oxidation process, and a large turn-on current is then obtained by a lifting technology for the drain and the source.

Major defects of the above-described silicon nanowire fabrication method lie in as follows. (1) The cost of the SOI substrate is higher than that of the silicon substrate. (2) The lifting technology for the drain and the source is complicated.

As to problems in the above-mentioned methods for fabricating silicon nanowire field effect transistor, a method for fabricating a silicon nanowire field effect transistor based on wet etching is provided by an embodiment of the present invention. By using the method of the present invention, the silicon nanowire field effect transistor can be easily fabricated over a bulk silicon wafer. Furthermore, the entire process flow is completely compatible with a fabrication technology of a typical silicon-based ultra-large-scale integrated circuit. The fabrication process is simple and convenient, and has a short cycle. Also, a diameter of a silicon nanowire channel of the silicon nanowire field effect transistor fabricated by such process can be controlled to ten nm approximately. A gate-all-around structure can provide a superior gate-control ability, which is suitable for fabricating an ultra short channel device and is capable of further reducing a size of the device. Finally, the silicon nanowire field effect transistor fabricated by such method has small serial resistances between source and drain, so that a higher turn-on current can be obtained without performing an additional lifting technology for the source/drain.

SUMMARY OF THE INVENTION

An object of an embodiment of the invention is to provide a method for fabricating a silicon nanowire field effect transistor based on wet etching. The object can be achieved by the following technical solutions.

A method for fabricating a silicon nanowire field effect transistor comprises the following steps.

a) Fabricating a pattern of a source, a drain and a fine bar connecting the source and the drain A main purpose of the step is to form the pattern of the source and the drain and the fine bar connecting the source and the drain over a hard mask by using electron beam lithography. A width of the fine bar may be formed about 100 nm by using the electron beam lithography. Such width is an optimum width for performing subsequent wet etching for a silicon substrate and suspending the fine bar. Further, a hard mask layer is added so as to prevent a top from being etched during performing the wet etching for the silicon substrate.

i. an active region is defined and a LOCOS isolation is formed.

ii. a silicon oxide film is deposited over the substrate as the hard mask.

iii. the pattern of the source and the drain and the fine bar connecting the source and the drain is formed on the hard mask, by using a process of electron beam lithography to etch the silicon oxide.

iv. a photoresist used in the electron beam lithography is removed.

v. the pattern on the hard mask is transferred to the silicon substrate by performing an etching process for the silicon substrate.

vi. an ion implantation is performed to suppress the parasitic bottom transistor.

b) Fabricating a suspended silicon nanowire connecting the source and the drain

A main purpose of the step is to suspend the silicon fine bar and make the silicon fine bar has an initial line width small as possible, by precisely controlling an etching rate of wet etching performed on the silicon substrate and using different etching times according to different widths of the fine bar, so that a diameter of the silicon nanowire may reach about 10 nm by subsequent sacrificial oxidation.

i. the silicon substrate is wet etched with an HNA solution, so that the silicon fine bar connecting the source and the drain is suspended.

ii. the silicon oxide hard mask is removed by wet etching.

iii. the suspended silicon fine bar connecting the source and the drain is reduced to a nano size by a sacrificial isolation, so as to form the silicon nanowire.

iv. a silicon oxide formed in the sacrificial isolation is removed by wet etching.

c) Fabricating a gate structure, and a source and drain structure

A main purpose of the step is to form the gate structure. Here, the gate structure needs to be defined by electron beam lithography. This is because by means of the electron beam lithography a width of the gate line can be easily controlled to about 32 nm, which is a desired width. A subsequent sidewall process in which a width of a sidewall is controlled to be about 20 nm is performed before performing an ion implanting for the source and the drain. Such structure is used mainly in consideration of three problems, that is, a serial resistance, a parasite capacitance and laterally diffusion of impurities of the source and the drain due to annealing. If the width of the sidewall is small, the serial resistances of a source extension region and a drain extension region under the sidewall are small, but the parasite capacitance between the source/drain and the gate is increased, and the impurities of the source and the drain are easily to be diffused to the channel, thus causing a risk of punchthrough of the source and the drain.

i. a gate oxide layer is formed through a thermal oxygen oxidation.

ii. a polysilicon film is deposited over the substrate as a gate material.

iii. a polysilicon gate line acrossing the silicon nanowire is formed by using electron beam lithography and subsequently etching the polysilicon film, so that a nanowire-all-around structure is formed.

iv. a photoresist used in the electron beam lithography is removing.

v. a silicon oxide sidewall is formed at both sides of the polysilicon gate line, by depositing a silicon oxide film and subsequently etching the silicon oxide film.

vi. the source and drain structure is formed by ion implantation and high temperature annealing.

d) Fabricating a metal contact and a metal interconnection

A main purpose of the step is to lead out a source, drain and gate terminal, so as to facilitate to test and form a large-scale circuit structure.

Technical effects of an embodiment of the present invention are as follows.

According to the method of the present invention, the silicon nanowire field effect transistor can be easily fabricated over a bulk silicon wafer. Furthermore, the entire process flow is completely compatible with a fabrication technology of a typical silicon-based ultra-large-scale integrated circuit. The fabrication process is simple and convenient, and has a short cycle. Also, a diameter of a silicon nanowire channel of the silicon nanowire field effect transistor fabricated by such process can be controlled to 10 nm approximately. The gate-all-around structure can provide a good gate-control ability, which is suitable for fabrication of an ultra short channel device and is capable of further reducing the size of the device. Finally, the silicon nanowire field effect transistor fabricated by such method has small serial resistances of the source and the drain, so that a higher turn-on current can be obtained without performing an additional lifting technology for the drain and the source.

BRIEF DESCRIPTION OF THE DRAWINGS

FIG. 1-6 are schematic diagrams showing a process flow of a method for fabricating a silicon nanowire field effect transistor based on wet etching according to an embodiment of the present invention. The process flow is briefly described as follows. FIG. 1 shows a step of defining an active region and forming LOCOS isolation. FIG. 2 shows a step of depositing a silicon oxide film over a substrate in an active region as a hard mask. FIG. 6 shows a step of forming a silicon oxide sidewall structure.

DETAILED DESCRIPTION OF THE EMBODIMENTS

Hereinafter, the present invention will be described in details by specific embodiments with reference to accompanying drawing. A detailed process solution of fabricating a silicon nanowire field effect transistor according to an embodiment of the present invention will be provided, but the scope of the invention is not limited thereto by any way.

An n-type silicon nanowire field effect transistor having a channel diameter of about 10 nm and a channel length of about 32 nm is fabricated according to the following steps.

1. A silicon oxide layer of 300 Å is deposited over a silicon substrate by low pressure chemical vapor deposition.

2. A silicon nitride layer of 1000 Å is deposited over the silicon oxide layer by low pressure chemical vapor deposition.

3. An active region is defined by performing photolithography.

4. The silicon nitride layer of 1000 Å is etched through anisotropic dry etching.

5. The silicon oxide layer of 300 Å is etched through anisotropic dry etching.

6. A silicon oxide layer of 5000 Å is grown by thermal oxidation, so as to form LOCOS isolation.

7. The silicon nitride layer of 1000 Å is etched through isotropic wet etching.

Figure 1:
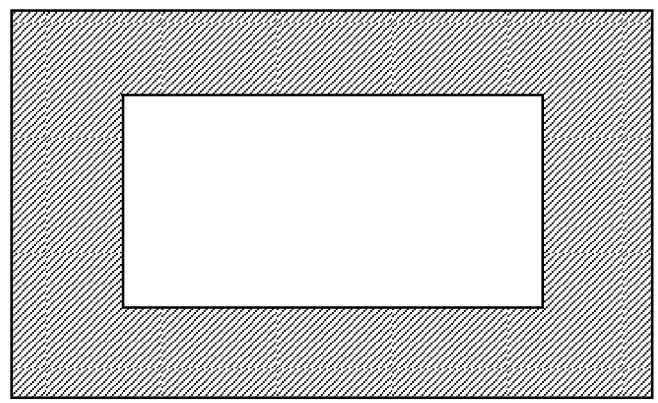

8. The silicon oxide layer of 300 Å is etched through isotropic wet etching, as shown in FIG. 1.

Figure 2:
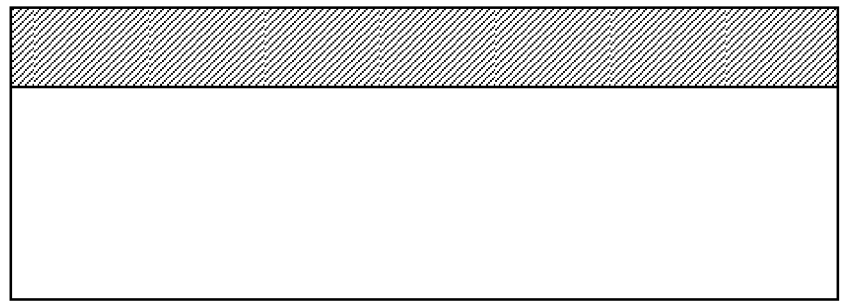

9. A silicon oxide layer of 2000 Å is deposited over a silicon substrate by low pressure chemical vapor deposition, so as to form a silicon oxide hard mask, as shown in FIG. 2.

10. A pattern of a source and a drain and a fine bar connecting the source and the drain are formed through electron beam lithography, in which the pattern of the fine bar has a width of 50 nm and a length of 300 nm.

11. The silicon oxide layer of 2000 Å is etched by anisotropic dry etching.

12. The silicon substrate of 2000 Å is etched by anisotropic dry etching, so as to transfer the pattern to the silicon substrate, as shown in FIGS. 3A to 3D.

13. $BF_2$ is implanted by ion implantation, with implantation energy of 50 keV and implantation dose of $1 \times 16$ cm$^{-2}$.

Figure 3A:
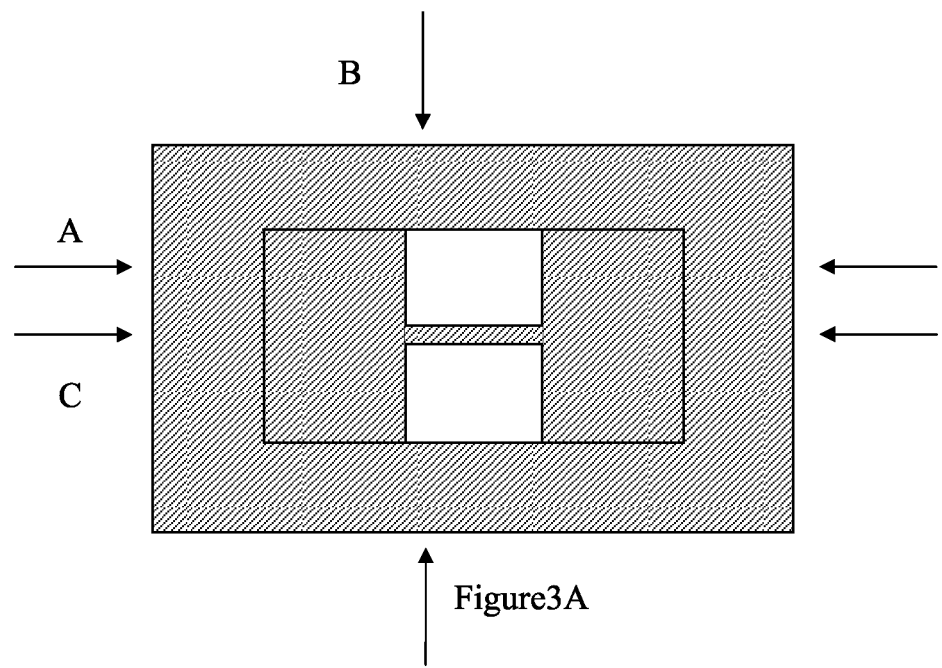
FIG. 3A is a plan view showing a step of forming a pattern of a source and a drain and a fine bar connecting the source and the drain through electron beam lithography, and etching the silicon oxide film and the silicon substrate through isotropic dry etching to transfer the above pattern to the silicon substrate.
Figure 3B:
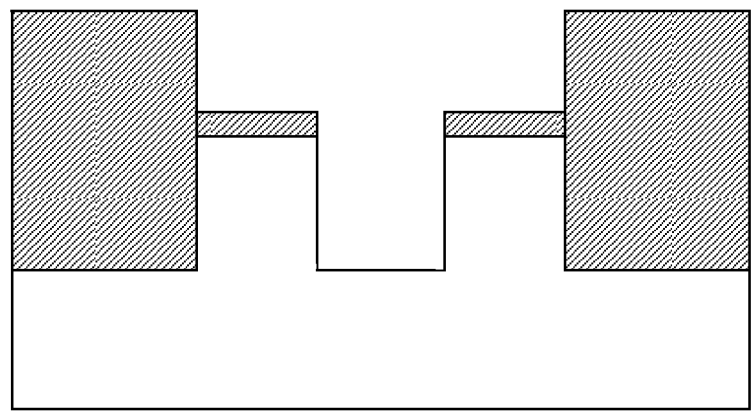
FIGS. 3B to 3D are cross-sectional views in directions of AA, BB and CC of the structure of FIG. 3A.
Figure 3C:
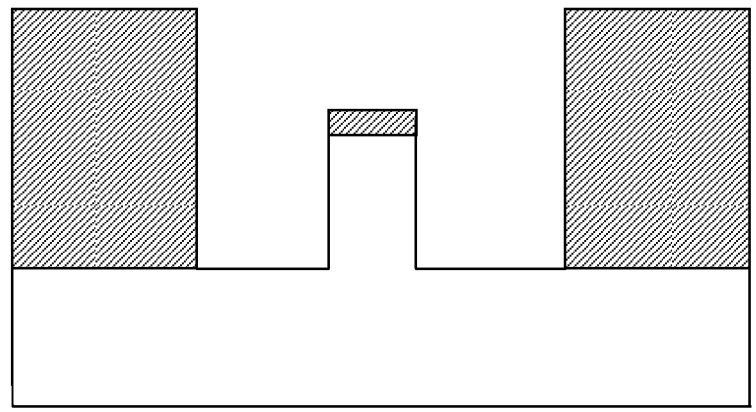
Figure 3D:
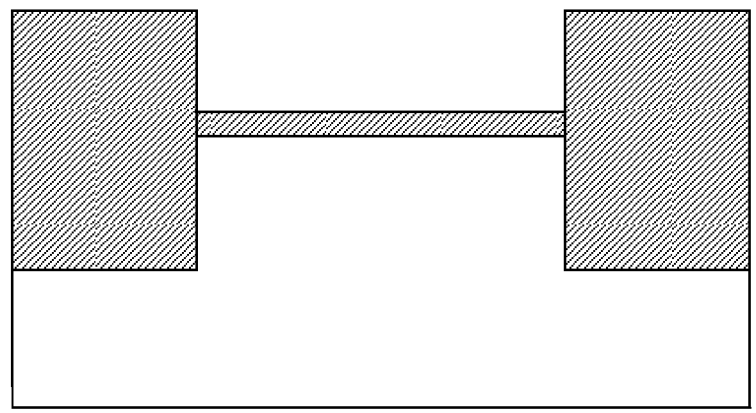
Figure 3E:
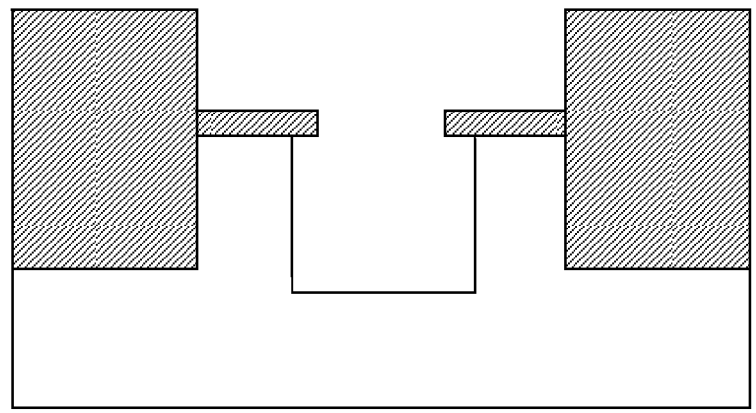
FIGS. 3E to 3G are cross-sectional views of the structure of FIG. 3 in directions of AA, BB and CC after the silicon substrate is wet etched.
Figure 3F:
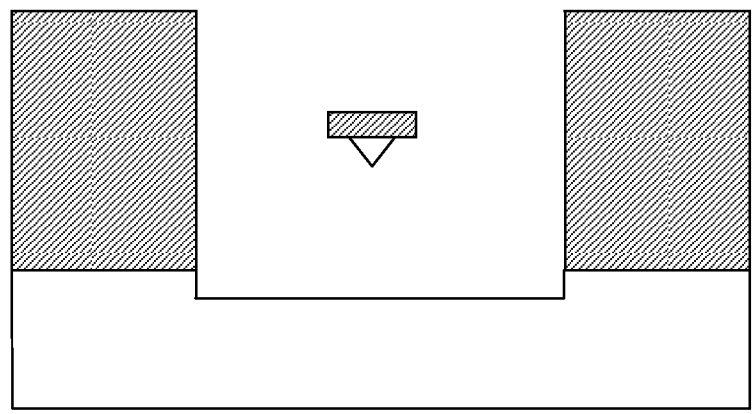
Figure 3G:
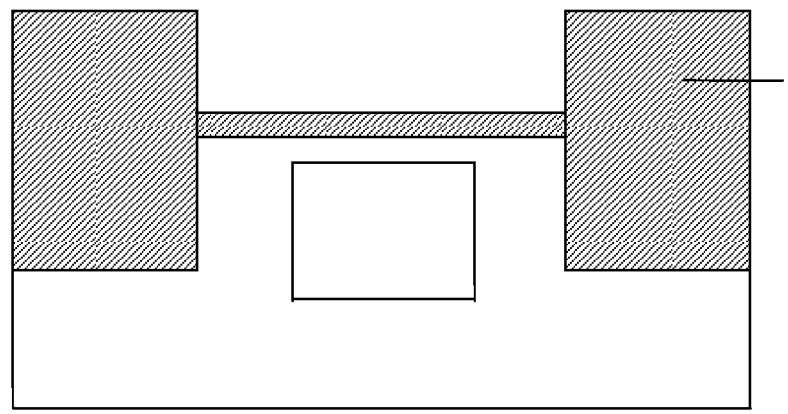
Figure 4A:
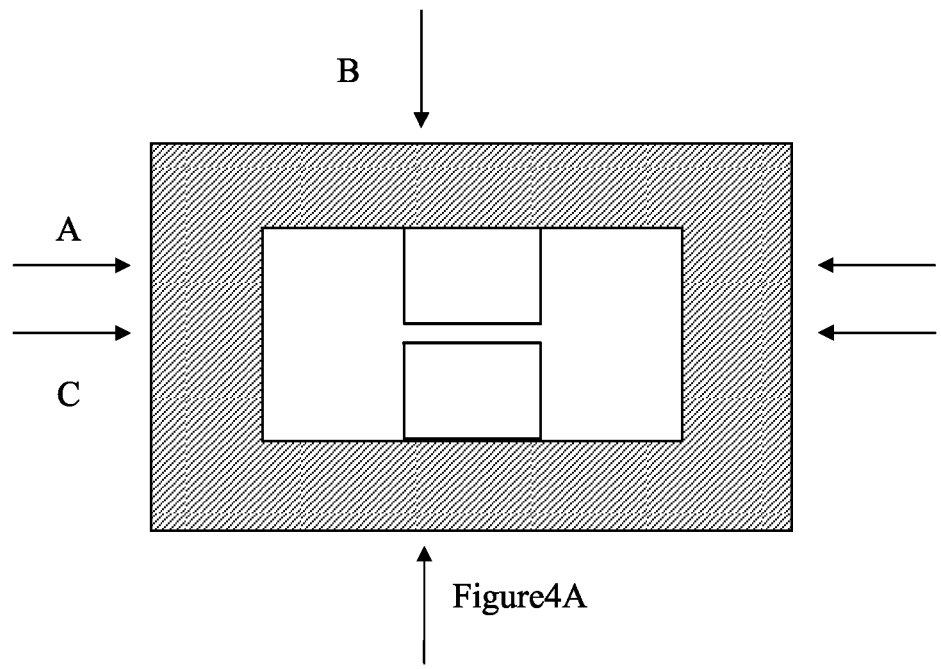
FIG. 4A is a resultant structure after removing the silicon oxide film by wet etching, performing sacrificial oxidation, and removing the silicon oxide film again by wet etching.
Figure 4B:
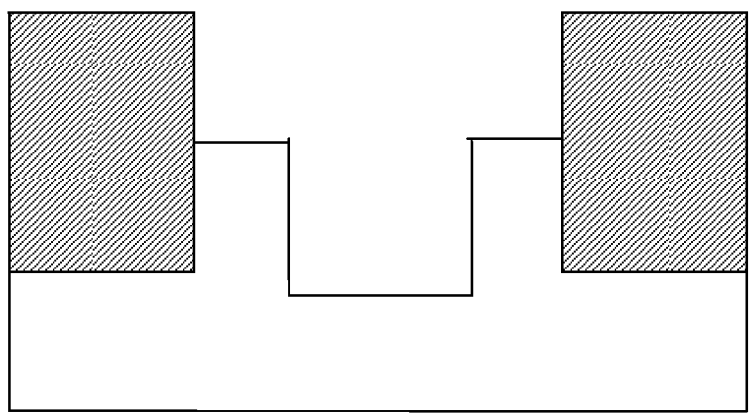
FIGS. 4B to 4D are cross-sectional views in directions of AA, BB and CC of the structure of FIG. 4A.
Figure 4C:
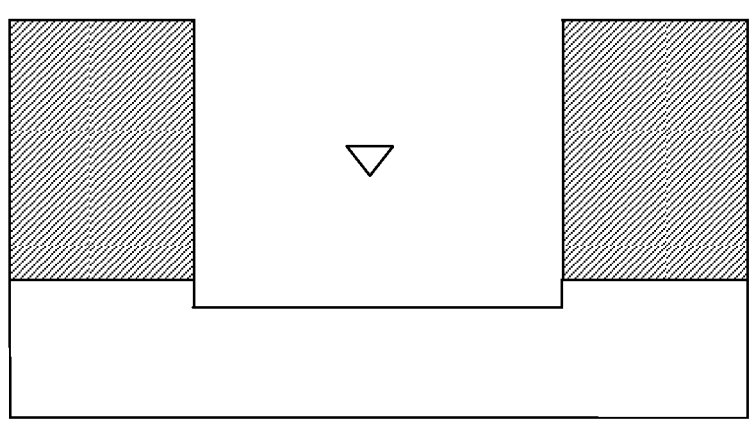
Figure 4D:
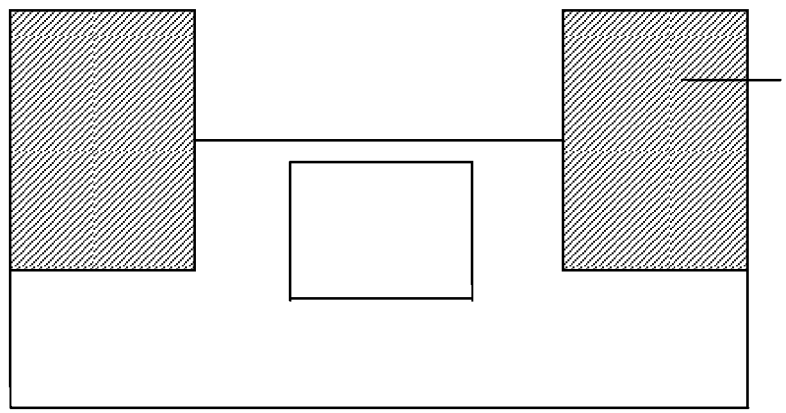
Figure 5A:
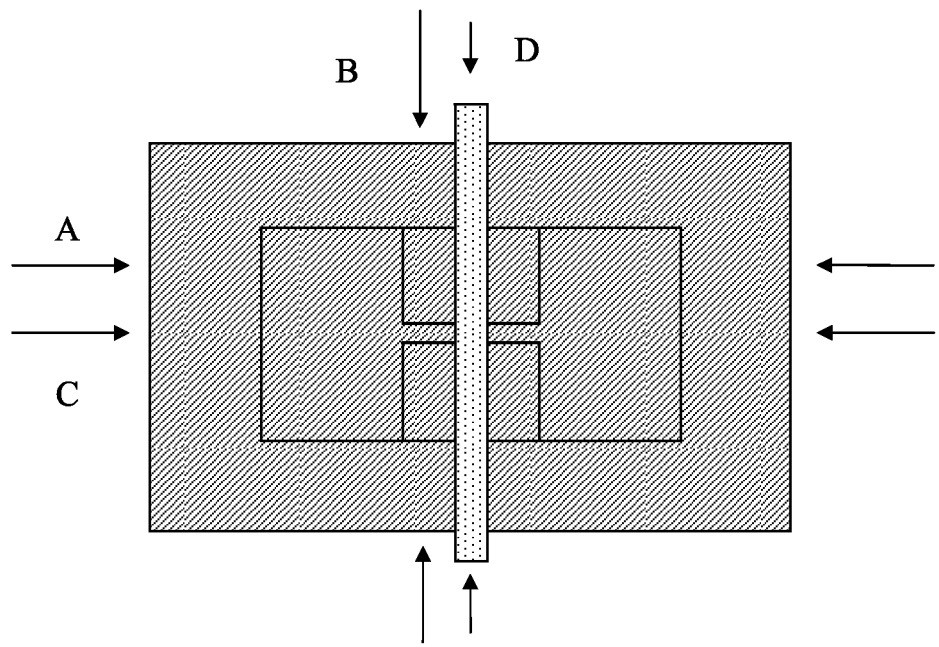
FIG. 5A shows a step of forming a polysilicon gate line after etching a polysilicon by electron beam lithography.
Figure 5B:
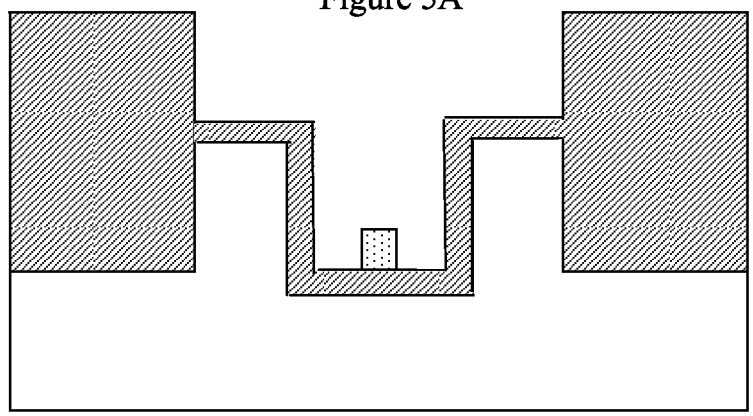
FIGS. 5B to 5E are cross-sectional views in directions of AA, BB and CC of the structure of FIG. 5A.
Figure 5C:
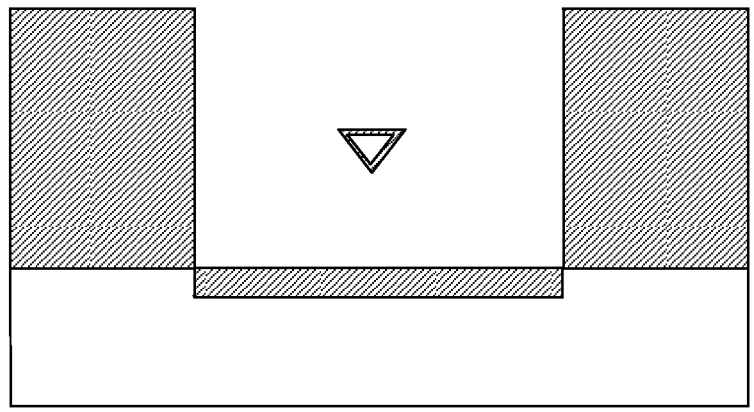
Figure 5D:
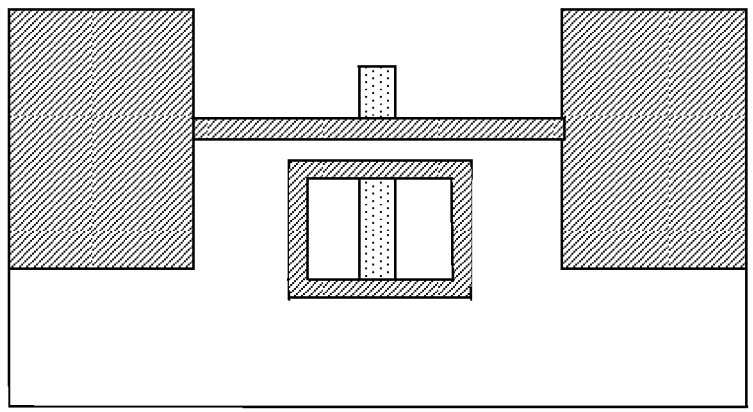
Figure 5E:
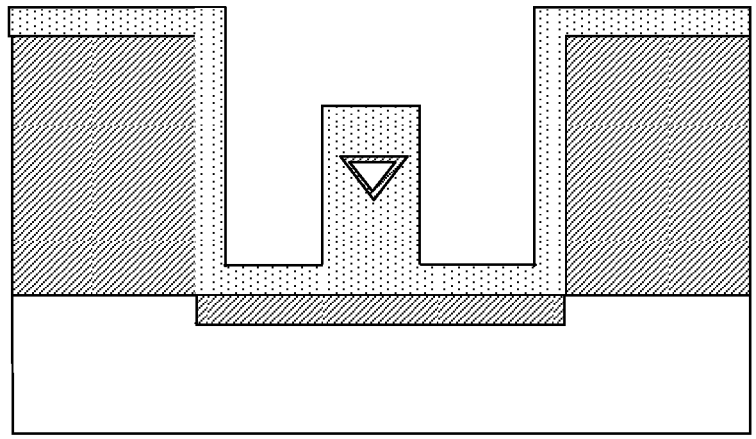

14. The silicon substrate is etched by 1000 Å through isotropic wet etching using an HNA solution, so as to suspend the nanowire, as shown in FIGS. 3E to 3G.

15. The silicon oxide of 2000 Å is etched by isotropic wet etching, so as to remove the silicon oxide hard mask.

16. A silicon oxide layer of 500 Å is grown by thermal growth as a sacrificial oxidation layer. The suspended fine silicon bar connecting the source and the drain is reduced to a nano size to form the silicon nanowire.

17. The silicon oxide of 500 Å is etched by isotropic wet etching and the sacrificial oxide layer is removed, as shown in FIGS. 4A to 4D.

18. A silicon oxide layer of 15 Å is grown as a gate oxide layer by thermal oxidation.

19. A polysilicon layer of 2000 Å is deposited as a gate material by low pressure chemical vapor deposition.

20. A fine gate line is defined by performing electron lithography. A width of the gate line is 32 nm.

21. The polysilicon layer of 2000 Å is etched by anisotropic dry etching, so as to form a fine gate line, as shown in FIGS. 5A to 5E.

22. A photoresist used in the electron beam lithography is removed.

23. A silicon oxide layer of 200 Å is deposited as a sidewall material by low pressure chemical vapor deposition.

24. The oxide layer of 200 Å is etched by anisotropic dry etching, so as to form a sidewall.

25. As is implanted into the source and drain. An implanting energy is 50 keV and an implanting dose is $4 \times 15$ cm$^{-2}$.

26. A RTP annealing is perform at 1050° C. for 5 seconds under an atmosphere of nitrogen, as shown in FIG. 6.

27. A metal contact and a metal interconnection are fabricated.

The embodiments described above are not to limit the present invention, and various modification and changes can be made without departing the scope and the spirit of the present invention. Therefore, the scope of the present invention is defined by the scope of the claim.

What is claimed is:

1. A method for fabricating a silicon nanowire field effect transistor based on a wet etching, comprising:
    a) fabricating a pattern of a source and a drain and a fine bar connecting the source and the drain, comprising:
        i. defining an active region and forming a LOCOS isolation;
        ii. depositing a silicon oxide film over a silicon substrate as a hard mask;
        iii. forming the pattern of the source and the drain and the fine bar connecting the source and drain on the hard mask, by using a process of electron beam lithography and etching the silicon oxide;
        iv. removing a photoresist used in the electron beam lithography;
        v. transferring the pattern on the hard mask to the silicon substrate by performing an etching process on the silicon substrate; and
        vi. performing an ion implantation to suppress a parasitic bottom transistor;
    b) fabricating a suspended silicon nanowire connecting the source and the drain, comprising:
        i. etching the silicon substrate by an isotropic wet etching using an HNA solution, so that an initial silicon fine bar connecting the source and the drain is suspended;
        ii. etching the silicon oxide hard mask by a wet etching; and
        iii. reducing the suspended silicon fine bar connecting the source and the drain to a nano size, wherein the reducing comprises growing a sacrificial silicon oxide layer on the suspended silicon fine bar by thermal growth followed by wet etching, so as to form a silicon nanowire;
    c) fabricating a gate structure, and a source and drain structure, comprising:
        i. forming a gate oxide layer through a thermal oxygen oxidation;
        ii. depositing a polysilicon film over the substrate as a gate material;
        iii. forming a polysilicon gate line across the silicon nanowire by using an electron beam lithography and subsequently etching the polysilicon film, so that a nanowire-all-around structure is formed;
        iv. removing a photoresist used in the electron beam lithography;
        v. forming a silicon oxide sidewall at both sides of the polysilicon gate line, by depositing the silicon oxide film and subsequently etching the silicon oxide film; and
        vi. forming the source and drain structure by an ion implantation and a high temperature annealing;
    d) fabricating a metal contact and a metal interconnection.

2. The method according to claim 1, wherein, the LOCOS isolation of step a) comprises:
    1) depositing a silicon oxide film over the substrate, and depositing a silicon nitride film over the silicon oxide film as a hard mask;
    2) defining a pattern of the active region by photolithography;
    3) etching the silicon nitride film and the silicon oxide film, so as to transfer the pattern to the hard mask;
    4) removing a photoresist;
    5) growing a silicon oxide layer by a thermal oxidation to form the LOCOS isolation.

3. The method according to claim 1, wherein, a chemical vapor deposition method is used to deposit the silicon oxide and the polysilicon.

4. The method according to claim 1, wherein, an anisotropic dry etching technology is used for etching the silicon oxide, the polysilicon and the substrate.

5. The method according to claim 1, wherein the suspended silicon fine bar comprises a portion of the silicon substrate.

6. The method according to claim 1, wherein an initial width of the suspended silicon fine bar of step (b-i) depends on the extent of the isotropic wet etching of the silicon substrate using the HNA solution.

7. The method according to claim 1, wherein the suspended silicon fine bar at step (b-i) is overlaid by the silicon oxide hard mask.

8. The method according to claim 1, wherein the width of the polysilicon gate line is less than the length of the silicon nanowire.

\* \* \* \* \*